(12) United States Patent
Kim et al.

(10) Patent No.: US 12,336,414 B2
(45) Date of Patent: Jun. 17, 2025

(54) DISPLAY DEVICE

(71) Applicant: Samsung Display Co., LTD., Yongin-si (KR)

(72) Inventors: Cha-Dong Kim, Yongin-si (KR); Jinseok Seo, Yongin-si (KR); In Kyung Yoo, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 18/309,610

(22) Filed: Apr. 28, 2023

(65) Prior Publication Data

US 2024/0049554 A1 Feb. 8, 2024

(30) Foreign Application Priority Data

Aug. 3, 2022 (KR) .................. 10-2022-0096800

(51) Int. Cl.
*H10K 59/40* (2023.01)
*H10K 59/124* (2023.01)
*H10K 59/80* (2023.01)
*G06F 3/044* (2006.01)

(52) U.S. Cl.
CPC .......... *H10K 59/40* (2023.02); *H10K 59/124* (2023.02); *H10K 59/873* (2023.02); *H10K 59/879* (2023.02); *G06F 3/0446* (2019.05)

(58) Field of Classification Search
CPC ............ H10K 59/00–95; G06F 3/0412; G06F 3/0446; G06F 3/0443; G06F 3/0445; G06F 3/041–047; G06F 2203/041–04114
See application file for complete search history.

(56) References Cited

U.S. PATENT DOCUMENTS

| | | | |
|---|---|---|---|
| 2019/0013495 A1* | 1/2019 | Kim | H10K 59/8792 |
| 2021/0013452 A1* | 1/2021 | Kim | H10K 59/8722 |
| 2021/0376037 A1* | 12/2021 | You | H10K 50/814 |
| 2022/0011904 A1* | 1/2022 | Son | G06F 3/0412 |
| 2022/0199698 A1* | 6/2022 | Son | H10K 59/879 |

FOREIGN PATENT DOCUMENTS

| | | | |
|---|---|---|---|
| KR | 10-1566433 B1 | | 11/2015 |
| KR | 20200071189 A | * | 6/2020 |
| KR | 10-2020-0078796 A | | 7/2020 |
| KR | 10-2020-0085968 A | | 7/2020 |
| KR | 10-2021-0122955 A | | 10/2021 |

OTHER PUBLICATIONS

KR-20200071189-A (Year: 2020).*

* cited by examiner

*Primary Examiner* — Sanjiv D. Patel
(74) *Attorney, Agent, or Firm* — Womble Bond Dickinson (US) LLP

(57) ABSTRACT

A display device includes: a substrate; a transistor on the substrate; a light-emitting device connected to the transistor; an encapsulation layer on the light-emitting device; a sensing electrode on the encapsulation layer; a first insulating layer on the sensing electrode and including an opening; a second insulating layer on the encapsulation layer and the first insulating layer; and a third insulating layer between the first insulating layer and the second insulating layer, wherein a refractive index of the second insulating layer is greater than a refractive index of the first insulating layer.

19 Claims, 12 Drawing Sheets

DISPLAY DEVICE

CROSS-REFERENCE TO RELATED APPLICATION

The present application claims priority to and the benefit of Korean Patent Application No. 10-2022-0096800 filed in the Korean Intellectual Property Office on Aug. 3, 2022, the entire content of which is incorporated herein by reference.

BACKGROUND

1. Field

Aspects of some embodiments of the present disclosure relate to a display device.

2. Description of the Related Art

A display device displays images on a screen, and includes, for example, a liquid crystal display (LCD) and an organic light emitting diode (OLED) display. A display device may be used for, or incorporated within, various electronic devices such as a portable phone, a GPS, a digital camera, an electronic book, a portable game device, or various terminals.

A display device generally has a multilayered structure. For example, the display device may be configured with a multilayered structure in which a light-emitting device and a touch sensor are stacked on a substrate. The screen may be displayed when light generated by the light-emitting device passes through the layers and is discharged outside the display device. However, some of the light generated by the light-emitting device may be reflected on an interlayer interface, so it may not be discharged to the outside but may become extinct. By this, light outputting efficiency and displaying quality at the front of the display device may be deteriorated.

The above information disclosed in this Background section is only for enhancement of understanding of the background and therefore the information discussed in this Background section does not necessarily constitute prior art.

SUMMARY

Aspects of some embodiments according to the present disclosure include a display device that may be capable of relatively increasing light outputting efficiency and relatively improving display quality.

However, characteristics of embodiments according to the present disclosure may not be limited to the above-described task, and may be expanded or modified in various ways without departing from the spirit and scope of embodiments according to the present invention.

According to some embodiments, a display device includes: a substrate; a transistor on the substrate; a light-emitting device connected to the transistor; an encapsulation layer on the light-emitting device; a sensing electrode on the encapsulation layer; a first insulating layer on the sensing electrode and including an opening; a second insulating layer on the encapsulation layer and the first insulating layer; and a third insulating layer between the first insulating layer and the second insulating layer, wherein a refractive index of the second insulating layer is greater than a refractive index of the first insulating layer.

According to some embodiments, the third insulating layer may include an inorganic insulating material.

According to some embodiments, the third insulating layer may include a silicon nitride.

According to some embodiments, the refractive index of the second insulating layer may be about 1.60 to about 1.90.

According to some embodiments, the refractive index of the first insulating layer may be about 1.40 to about 1.59.

According to some embodiments, the second insulating layer may be thicker than the first insulating layer.

According to some embodiments, a thickness of the second insulating layer may be about 5 μm to about 15 μm.

According to some embodiments, the refractive index of the second insulating layer may be about 1.85, and the thickness of the second insulating layer may be about 14 μm.

According to some embodiments, the thickness of the first insulating layer may be about 2 μm to about 5.5 μm.

According to some embodiments, the thickness of the third insulating layer may be equal to or less than about 500 Å.

According to some embodiments, the third insulating layer may include a silicon nitride.

According to some embodiments, an opening of the first insulating layer may be filled with the second insulating layer and the third insulating layer, a lateral side and an upper side of the first insulating layer may be covered by the third insulating layer, and an upper side of the third insulating layer may be covered by the second insulating layer.

According to some embodiments a display device includes: a substrate; a transistor on the substrate; a light-emitting device connected to the transistor; an encapsulation layer on the light-emitting device; a sensing electrode on the encapsulation layer; a first insulating layer on the sensing electrode and including an opening; and a second insulating layer on the encapsulation layer and the first insulating layer, wherein a refractive index of the second insulating layer is greater than a refractive index of the first insulating layer, and a thickness of the second insulating layer is about 5 μm to about 15 μm.

According to some embodiments, the second insulating layer may be thicker than the first insulating layer.

According to some embodiments, the thickness of the first insulating layer may be about 2 μm to about 5.5 μm.

According to some embodiments, the refractive index of the second insulating layer may be about 1.60 to about 1.90.

According to some embodiments, the refractive index of the first insulating layer may be 1.40 to 1.59.

According to some embodiments, the display device may further include a third insulating layer between the first insulating layer and the second insulating layer.

According to some embodiments, the thickness of the third insulating layer may be equal to or less than 500 Å.

According to some embodiments, the third insulating layer may include a silicon nitride.

According to some embodiments, the light outputting efficiency and the display quality of the display device may be relatively improved or increased.

The characteristics of embodiments according to the present embodiments are not limited to the above-described characteristics, and it may be expanded in various ways without departing from the spirit and scope of embodiments according to the present invention.

DETAILED DESCRIPTION

Figure 1:
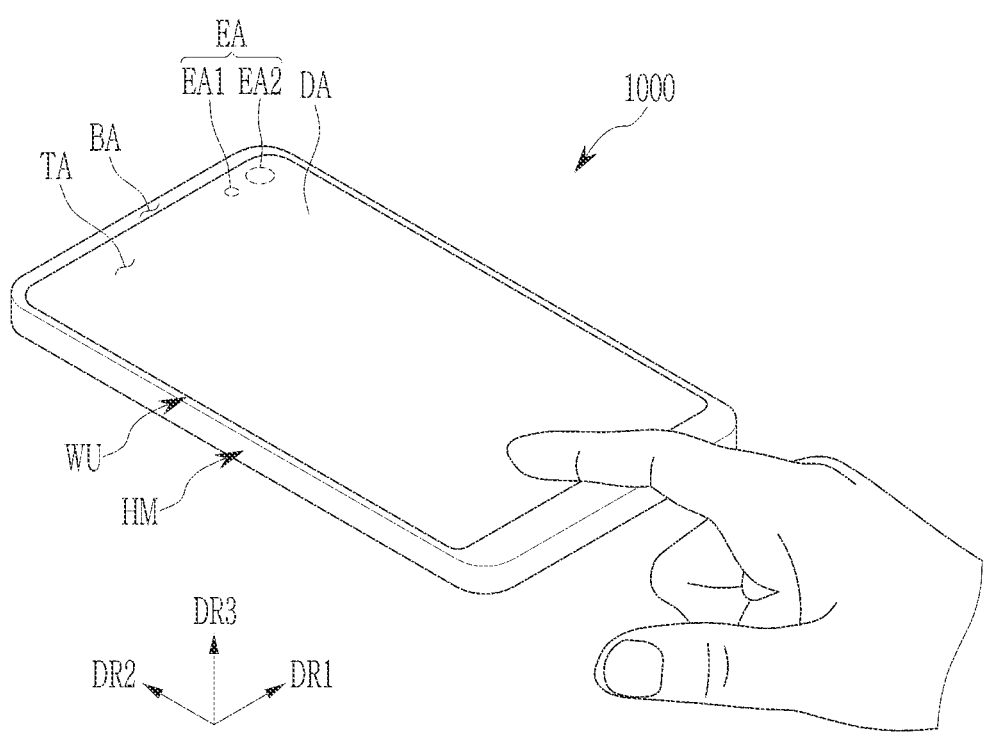
FIG. 1 shows a perspective view on a using state of a display device according to some embodiments.

Aspects of some embodiments of the present invention will be described more fully hereinafter with reference to the accompanying drawings, in which aspects of some embodiments of the invention are shown. As those skilled in the art would realize, the described embodiments may be modified in various different ways, all without departing from the spirit or scope of embodiments according to the present invention.

The drawings and description are to be regarded as illustrative in nature and not restrictive, and like reference numerals designate like elements throughout the specification.

The size and thickness of each configuration shown in the drawings are arbitrarily shown for better understanding and ease of description, but the present invention is not limited thereto. The thicknesses of layers, films, panels, regions, etc., are enlarged for clarity. For better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Unless explicitly described to the contrary, the word "comprise", and variations such as "comprises" or "comprising", will be understood to imply the inclusion of stated elements but not the exclusion of any other elements.

The phrase "on a plane" means viewing the object portion from the top, and the phrase "on a cross-section" means viewing a cross-section of which the object portion is vertically cut from the side.

Various embodiments and variations will now be described in more detail with reference to accompanying drawings.

Figure 2:
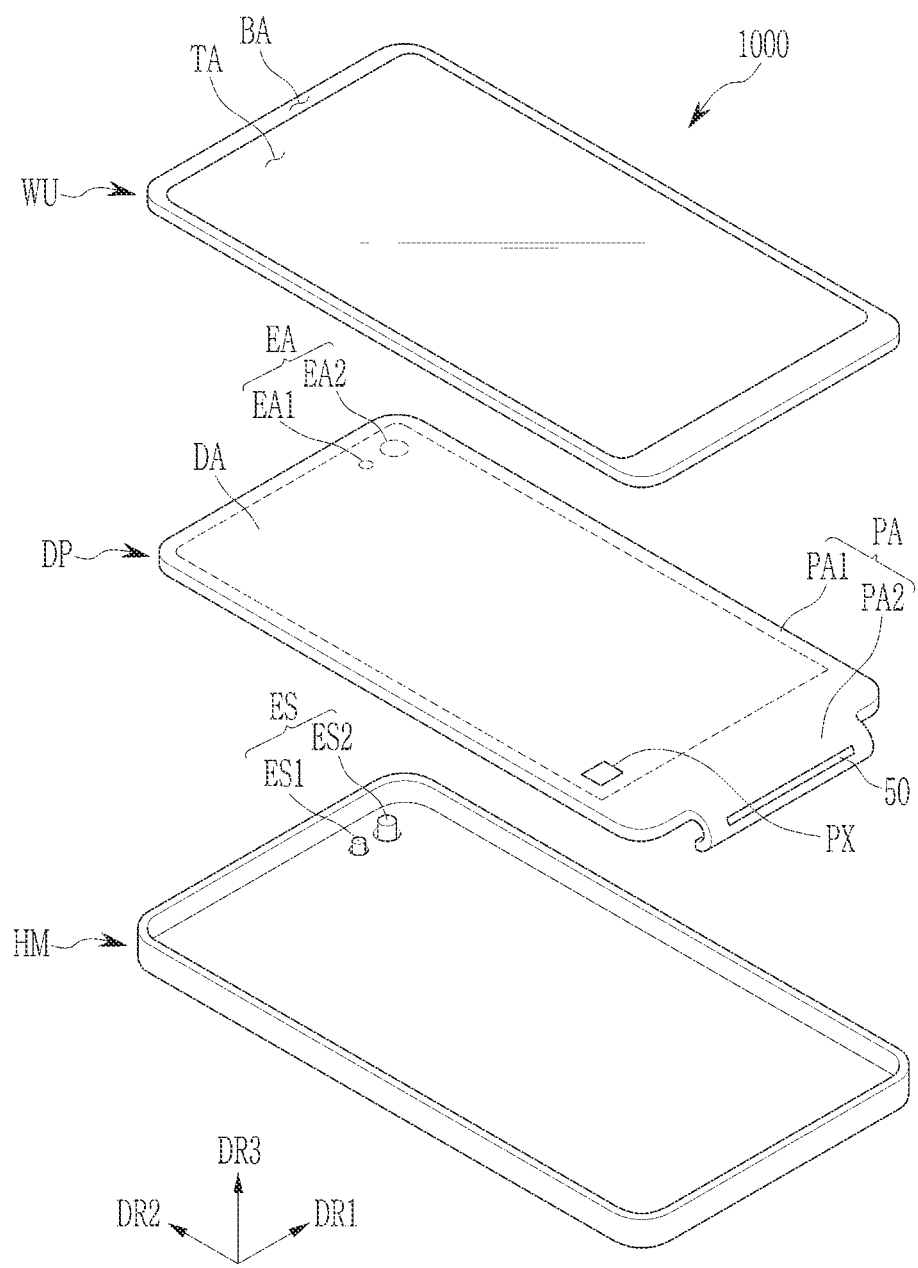
FIG. 2 shows an exploded perspective view of a display device according to some embodiments.
Figure 3:
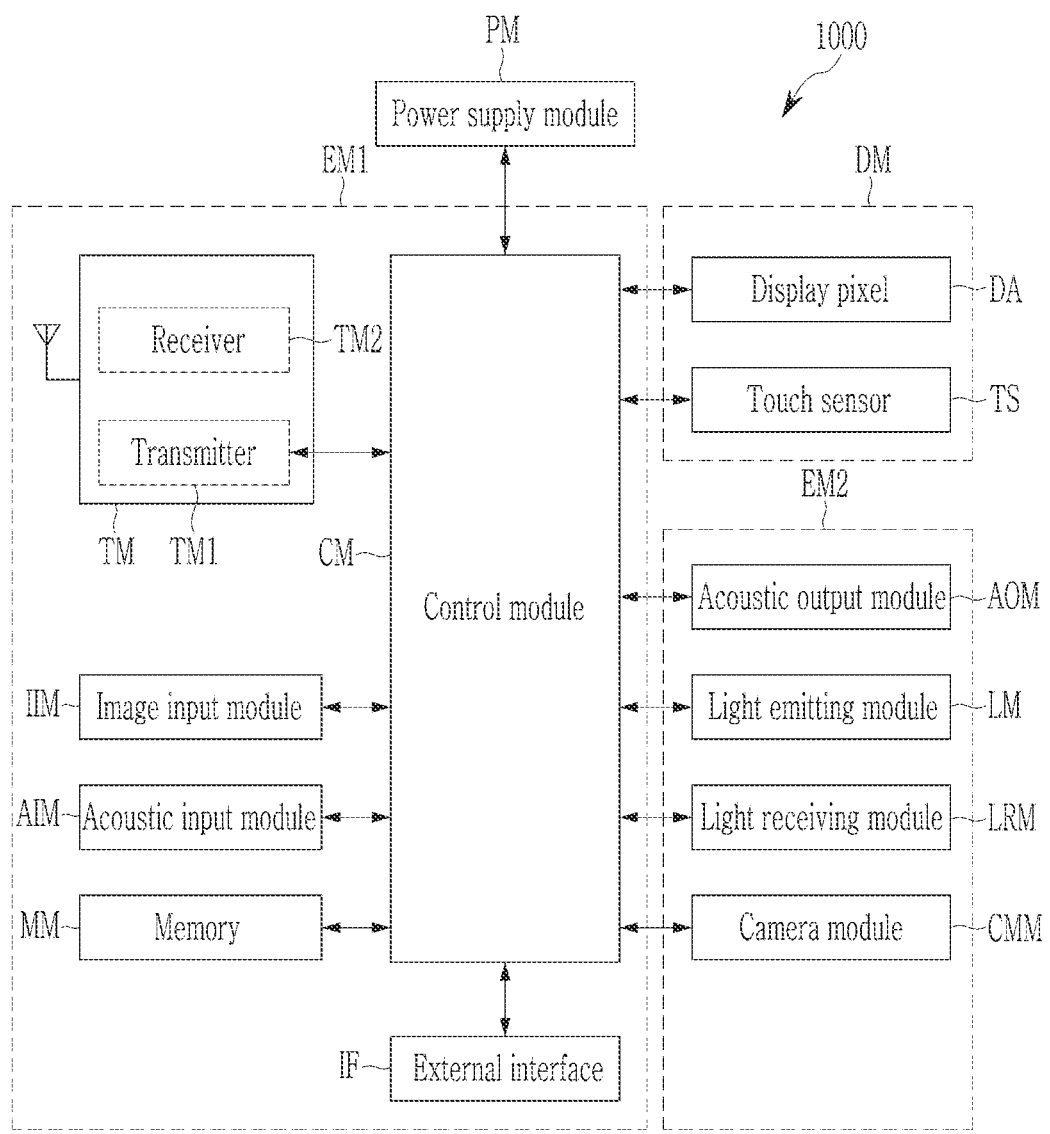
FIG. 3 shows a block diagram of a display device according to some embodiments.

A structure of a display device will now be described in more detail with reference to FIG. 1 to FIG. 3. FIG. 1 shows a perspective view of a using state of a display device according to some embodiments, FIG. 2 shows an exploded perspective view of a display device according to some embodiments, and FIG. 3 shows a block diagram of a display device according to some embodiments.

Referring to FIG. 1, the display device 1000 represents a device for displaying videos or still images, and it may be used as a display screen for portable electronic devices such as mobile phones, smartphones, tablet personal computers (PC), mobile communication terminals, electronic organizers, electronic books, portable multimedia players (PMP), global positioning systems, or ultra mobile PCs (UMPC), and also for various products such as televisions, laptops, monitors, advertisement boards, or the internet of things (IOT). The display device 1000 may also be used for wearable devices such as smart watches, watch phones, glasses-type displays, or head mounted displays (HMD). The display device 1000 may be used as a dashboard of a vehicle, a center information display (CID) located on a center fascia or a dashboard of a vehicle, a room mirror display replacing a side-view mirror of a vehicle, and a display located on a rear side of a front seat for entertainment for a back seat of a vehicle. FIG. 1 shows that the display device 1000 is used as a smartphone, for better comprehension and ease of description.

The display device 1000 may display images in a third direction DR3 to a displaying side in parallel to a first direction DR1 and a second direction DR2. A displaying side on which images are displayed may correspond to a front surface of the display device 1000, and may correspond to a front surface of a cover window WU. The images may include videos and still images.

According to some embodiments, front surfaces (upper sides) and bottom surfaces (lower sides) of respective members may be defined with respect to the image displaying direction. The front surface and the bottom surface oppose each other in the third direction DR3, and normal directions of the respective front surface and the bottom surface may be parallel to the third direction DR3. A spaced distance between the front surface and the bottom surface in the third direction DR3 may correspond to the thickness of the display panel in the third direction DR3.

The display device 1000 may sense an input (refer to a hand of FIG. 1) of a user applied from an outside. The user input may include various types of external inputs such as some of a human body of the user, light, heat, or pressure. The user input is shown to be a hand of the user applied to the front surface. The present disclosure is not limited thereto. The user input may be provided in various forms. The display device 1000 may sense the user input applied to the lateral side or the bottom surface of the display device 1000 according to the structure of the display device 1000.

Referring to FIG. 1 and FIG. 2, the display device 1000 may include a cover window WU, a housing HM, a display panel DP, and an optical element ES. The cover window WU may be combined to the housing HM to configure an exterior of the display device 1000.

The cover window WU may include an insulation panel. For example, the cover window WU may be made of glass, plastic, or a combination thereof.

The front surface of the cover window WU may define the front surface of the display device 1000. The transmission area TA may be an optically transparent region. For example, the transmission area TA may have visible ray transmittance of equal to or greater than about 90%.

The blocking area BA may define a shape of the transmission area TA. The blocking area BA may be located near the transmission area TA and may surround the transmission area TA. The blocking area BA may have relatively lower light transmittance than the transmission area TA. The blocking area BA may include an opaque material for blocking light. The blocking area BA may have a predetermined color. The blocking area BA may be defined by a bezel layer provided in addition to a transparent substrate for defining the transmission area TA, or may be defined by an ink layer inserted into or colored to the transparent substrate.

The display panel DP may include a front surface including a display area DA and a non-display area PA. The display area DA allows pixels to be operable by electrical signals and emit light. The non-display area PA of the display panel DP may include a driver 50.

The display area DA includes pixels and displays images, a touch sensor is positioned on an upper side of the display area DA in the third direction DR3 of the pixel, and the display area DA thus senses external inputs.

The transmission area TA of the cover window WU may at least partly overlap the display area DA of the display panel DP. For example, the transmission area TA may overlap the entire side of the display area DA or may overlap at least part of the display area DA. Hence, the user may see the images through the transmission area TA or may provide external inputs based on the images. However, the present disclosure is not limited thereto. For example, the region in which images are displayed may be separated from the region from which external inputs are sensed in the display area DA.

The non-display area PA of the display panel DP may at least partly overlap the blocking area BA of the cover window WU. The non-display area PA may be covered by the blocking area BA. The non-display area PA may be located near the display area DA, and may surround the display area DA. The non-display area PA displays no images, and a driving circuit for driving the display area DA or driving wires may be located therein. The non-display area PA may include a first peripheral area PA1 positioned on an outside of the display area DA, and a second peripheral area PA2 including a driver 50, a connection wire, and a bending region. According to some embodiments as described with reference to FIG. 2, the first peripheral area PA1 is positioned on one side of the display area DA, and the second peripheral area PA2 is positioned in the other side of the display area DA.

The display panel DP may be assembled in a flat state so that the display area DA and the non-display area PA may face the cover window WU. However, the present disclosure is not limited thereto. A predetermined portion of the non-display area PA of the display panel DP may be bent. Part of the non-display area PA faces the bottom surface of the display device 1000 so the blocking area BA seen on the front surface of the display device 1000 may be reduced, and in FIG. 2, the second peripheral area PA2 may be bent to be positioned on the bottom surface of the display area DA and be assembled.

The display panel DP may include a component area EA, and in detail, it may include a first component area EA1 and a second component area EA2. The first component area EA1 and the second component area EA2 may be at least partly surrounded by the display area DA. The first component area EA1 and the second component area EA2 are shown to be spaced from each other, and without being limited thereto, at least part thereof may be connected to each other. The first component area EA1 and the second component area EA2 may represent regions below which components using infrared rays, visible rays, or sound are located.

The display area DA includes a plurality of light emitting diodes and a plurality of pixel circuits for generating light emitting currents and transmitting the same to the light emitting diodes. Here, one light emitting diode and one pixel circuit configure a pixel PX. One pixel circuit and one light emitting diode may be formed one on one in the display area DA.

The first component area EA1 includes a region of a transparent layer for transmitting light, no conductive layer or semiconductor layer is positioned therein, and a pixel defining layer and a light blocking layer including light blocking materials include openings overlapping the position that corresponds to the first component area EA1 to thus have a configuration that does not block light.

The second component area EA2 may include a transmission unit through which light or/and sound transmit and a display unit including pixels. The transmission unit is position between adjacent pixels and is configured with a transparent layer through which light or/and sound transmit. The display unit may be formed to have a unit structure by combining the pixels, and the transmission unit may be positioned between the adjacent unit structure.

Referring to FIG. 3 together with FIG. 1 and FIG. 2, the display panel DP may include a display area DA including display pixels and a touch sensor TS. The display panel DP includes pixel for generating images and it may be visible to users from the outside through the transmission area TA. The touch sensor TS may be positioned on an upper portion of the pixel, and may sense external inputs applied from the outside. The touch sensor TS may sense external inputs provided to the cover window WU.

Referring to FIG. 2, the second peripheral area PA2 may include a bending portion. The display area DA and the first peripheral area PA1 may have a planar shape that is substantially parallel to a plane defined by the first direction DR1 and the second direction DR2, and one side of the second peripheral area PA2 may extend from the planar shape, may pass through the bending portion, and may again have a planar shape. At least part of the second peripheral area PA2 may be bent and may be assembled to be positioned on the rear side of the display area DA. When assembled, the at least part of the second peripheral area PA2 overlaps the display area DA in a plan view, thereby reducing the blocking area BA of the display device 1000. However, the present disclosure is not limited thereto. For example, the second peripheral area PA2 may not be bent.

The driver 50 may be installed in the second peripheral area PA2, and may be positioned on the bending portion or one of respective sides of the bending portion. The driver 50 may be provided in a chip form.

The driver 50 may be electrically connected to the display area DA and may transmit electrical signals to the display area DA. For example, the driver 50 may provide data signals to the pixels PX located in the display area DA. In another way, the driver 50 may include a touch driving circuit, and may be electrically connected to the touch sensor TS located in the display area DA. The driver 50 may be designed to include various types of circuits in addition to the above-described circuits or provide various electrical signals to the display area DA.

A pad portion may be positioned at the end portion of the second peripheral area PA2, and the display device 1000 may be electrically connected to a flexible printed circuit board (FPCB) including a driving chip by the pad portion.

The driving chip positioned on the flexible printed circuit board may include various types of driving circuits for driving the display device 1000 or a connector for supplying a power voltage. Depending on embodiments, instead of the flexible printed circuit board, a rigid printed circuit board (PCB) may be used.

The optical element ES may be located on a lower portion of the display panel DP. The optical element ES may include a first optical element ES1 overlapping the first component area EA1 and a second optical element ES2 overlapping the second component area EA2.

The first optical element ES1 may be an electronic element using light or sound. For example, the first optical element ES1 may be a sensor such as an infrared sensor for receiving light and using it, a sensor for outputting and sensing light or sound to measure distances or recognize fingerprints, a small lamp for outputting light, or a speaker for outputting sound. The electronic element using light may use various wavelengths of light such as visible light, infrared rays, and ultraviolet rays.

The second optical element ES2 may be at least one of a camera, an infrared (IR) camera, a dot projector, an IR illuminator, or a time-of-flight (ToF) sensor.

Referring to FIG. 3, the display device 1000 may include a display panel DP, a power supply module PM, a first electronic module EM1, and a second electronic module EM2. The display panel DP, the power supply module PM, the first electronic module EM1, and the second electronic module EM2 may be electrically connected to each other. FIG. 3 illustrates a display pixel and a touch sensor TS positioned in the display area DA from among the configuration of the display panel DP.

The power supply module PM may supply a power voltage for a general operation of the display device 1000. The power supply module PM may include a conventional battery module.

The first electronic module EM1 and the second electronic module EM2 may include various types of functional modules for operating the display device 1000. The first electronic module EM1 may be mounted on a motherboard electrically connected to the display panel DP, or may be mounted on and additional substrate and may then be electrically connected to the motherboard through a connector.

The first electronic module EM1 may include a control module CM, a radio communication module TM, an image input module IIM, an acoustic input module AIM, a memory MM, and an external interface IF. Some of the modules may not be mounted on the motherboard, and may be electrically connected to the motherboard through a flexible printed circuit board connected thereto.

The control module CM may control the general operation of the display device 1000. The control module CM may be a microprocessor. For example, the control module CM may activate/deactivate the display panel DP. The control module CM may control the other modules such as the image input module IIM or the acoustic input module AIM based on the touch signal received from the display panel DP.

The radio communication module TM may transmit/receive radio signals to/from other terminals by using Bluetooth or Wi-Fi lines. The radio communication module TM may transmit/receive voice signals by using a general communication line. The radio communication module TM includes a transmitter TM1 for modulating signals and transmitting the signals, and a receiver TM2 for demodulating the received signals.

The image input module IIM may process image signals and may convert the same into image data displayable on the display panel DP. The acoustic input module AIM may receive external acoustic signals by the microphone in a recording mode or a voice recognition mode, and may convert the same into electrical voice data.

The external interface IF may function as an interface connected to an external charger, a cord/cordless data port, or a card socket (e.g., a memory card or a SIM/UIM card).

The second electronic module EM2 may include an acoustic output module AOM, a light emitting module LM, a light receiving module LRM, and a camera module CMM, and at least some thereof may be positioned as optical elements ES on the bottom surface of the display area DA as shown in FIG. 1 and FIG. 2. The optical element ES may include a light emitting module LM, a light receiving module LRM, and a camera module CMM. The second electronic module EM2 may be mounted on the motherboard, may be mounted on an additional substrate and be electrically connected to the display panel DP through a connector, or may be electrically connected to the first electronic module EM1.

The acoustic output module AOM may convert the acoustic data received from the radio communication module TM or the acoustic data stored in the memory MM and may output the converted signals.

The light emitting module LM may generate light and may output the light. The light emitting module LM may output infrared rays. For example, the light emitting module LM may include an LED element. For example, the light receiving module LRM may sense the infrared rays. The light receiving module LRM may be activated when the infrared rays with equal to or greater than a predetermined level are sensed. The light receiving module LRM may include a CMOS sensor. When the infrared rays generated by the light emitting module LM are output, they may be reflected on an external subject (e.g., a finger or a face of the user), and the reflected infrared rays may be input to the light receiving module LRM. The camera module CMM may photograph external images.

The optical element ES may additionally include a photosensor or a thermal sensor. The optical element ES may sense the external subject received through the front surface or may provide sound signals such as a voice to the outside through the front surface. The optical element ES may include a plurality of constitutional elements, and is not limited to one embodiment.

Referring to FIG. 2, the housing HM may be combined to the cover window WU. The cover window WU may be located on the front surface of the housing HM. The housing HM may be combined to the cover window WU and may provide a predetermined receiving space. The display panel DP and the optical element ES may be received in a predetermined receiving space provided between the housing HM and the cover window WU.

The housing HM may include a material with relatively great rigidity. For example, the housing HM may include glass, plastic, or metal, or may include a plurality of frames and/or plates configured with a combination thereof. The housing HM may stably protect the constitutional elements of the display device 1000 received in an internal space from external impacts.

Figure 4:
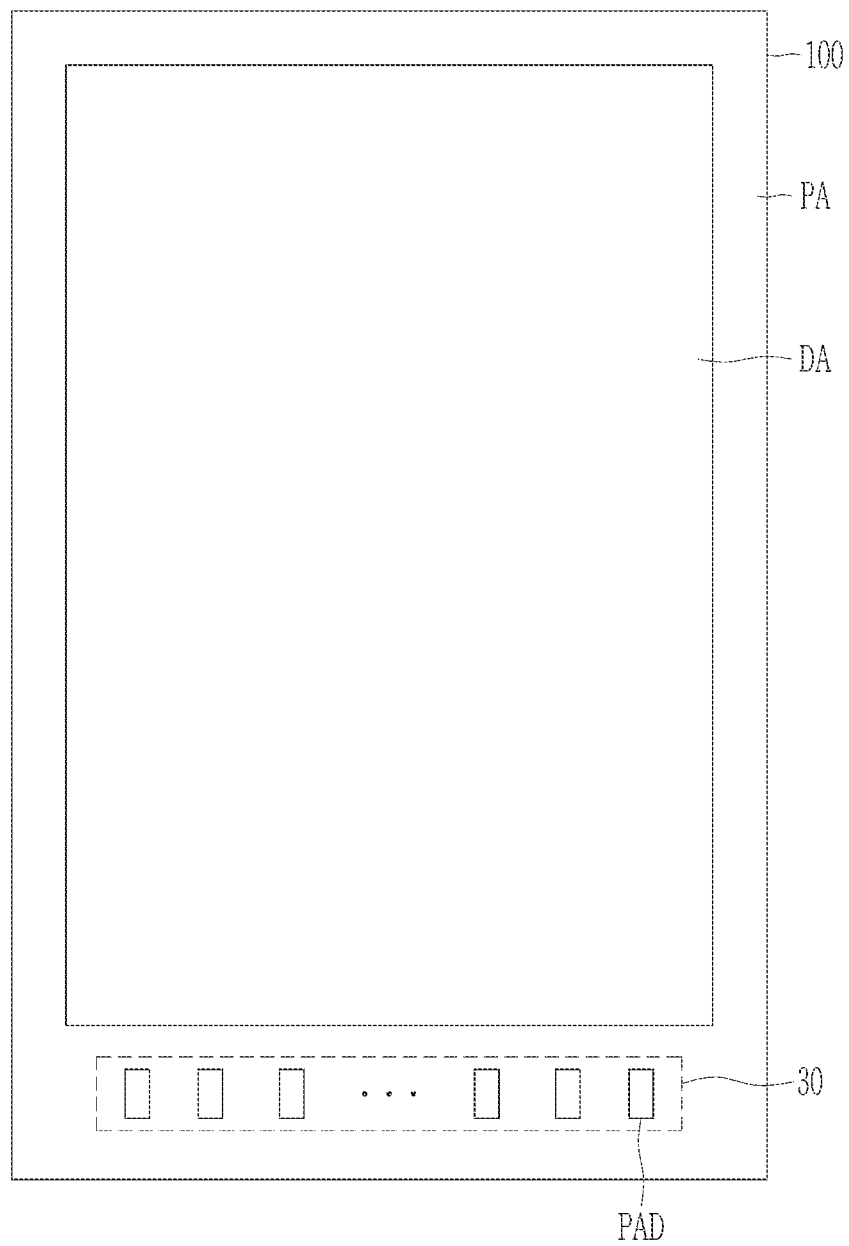
FIG. 4 shows a top plan view on part of a display device according to some embodiments.
Figure 5:
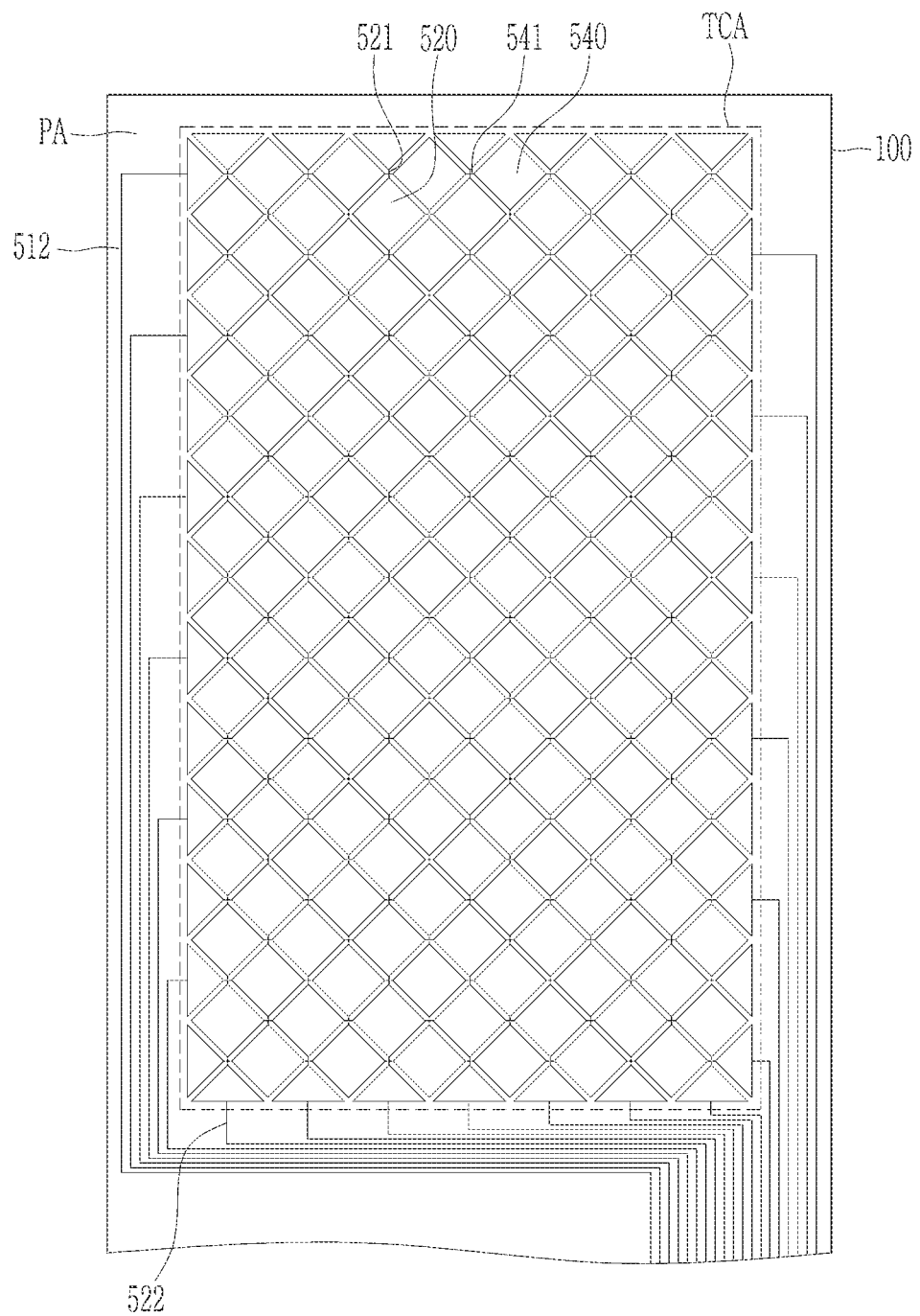
FIG. 5 shows a top plan view on a portion including a sensor of a display device of FIG. 4 according to some embodiments.

A display panel of a display device according to some embodiments will now be described with reference to FIG. 4 and FIG. 5. FIG. 4 shows a top plan view on part of a display device according to some embodiments, and FIG. 5 shows a top plan view on a portion including a sensor of a display device according to some embodiments of FIG. 4.

Referring to FIG. 4, a display panel DP of the display device 1000 according to some embodiments includes a substrate 100 and a pad unit 30.

The substrate 100 includes a display area DA and a non-display area PA. The pixels including light emitting diodes and transistors are formed in the display area DA to display images, and the non-display area PA displays no images. The non-display area PA may surround the display area DA. The non-display area PA includes a pad unit 30 on which pads PAD for applying driving signals to the pixels are formed.

A plurality of pixels including transistors and light emitting diodes may be positioned in the display area DA. The pixels may be arranged in various forms, for example, a matrix form.

Referring to FIG. 4 and FIG. 5, a sensing area TCA including a plurality of sensing electrodes 520 and 540 may be positioned on an upper portion of the display area DA so as to recognize touches. A touch sensor may be positioned in the sensing area TCA.

Driving voltage lines for transmitting driving signals such as voltages or signals to the pixels formed in the display area DA, driving low voltage lines, and a pad unit 30 may be positioned in the non-display area PA. A plurality of sensing wires 512 and 522 may be further positioned in the non-display area PA. The sensing wires 512 and 522 may be connected to the sensing electrodes 520 and 540.

The pad unit 30 is positioned in part of the non-display area PA, and includes a plurality of pads PAD. Voltages and signals may be applied to voltage lines and the sensing wires 512 and 522 connected to the display area DA through the pads PAD. A flexible printed circuit board FPCB may be attached to the non-display area PA. The flexible printed circuit board FPCB may be electrically connected to the pad unit 30. The flexible printed circuit board FPCB and the pad unit 30 may be electrically connected to each other by an anisotropic conductive film. The flexible printed circuit board FPCB may include a driving integrated circuit, and driving signals output by the driving integrated circuit may be supplied to the respective pixels through the pads PAD of the pad unit 30.

As shown in FIG. 5, the substrate 100 may include a sensing area TCA in which the sensing electrodes 520 and 540 are formed and a non-display area PA surrounding the sensing area TCA on the upper portion of the display area DA. Depending on embodiments, the sensing area TCA may include part of the display area DA and the non-display area PA of FIG. 4. This is, however, an example, and the position of the sensing area TCA is variable. For example, the sensing area TCA may include part of the display area DA, or the sensing area TCA may include the display area DA and the non-display area PA.

The sensing area TCA may include a plurality of sensing electrodes 520 and 540. The sensing electrodes 520 and 540 may include a plurality of first sensing electrodes 520 and a plurality of second sensing electrodes 540.

The first sensing electrodes 520 and the second sensing electrodes 540 may be electrically separated from each other. Depending on embodiments, the first sensing electrode 520 may be a sensing input electrode, and the second sensing electrode 540 may be a sensing output electrode. This is, however, not limited, and the first sensing electrode 520 may be a sensing output electrode, and the second sensing electrode 540 may be a sensing input electrode.

The first sensing electrodes 520 and the second sensing electrodes 540 may be alternately distributed and may be arranged in a mesh form so that they may not overlap each other in the sensing area TCA. The first sensing electrodes 520 may be arranged in a column direction and a row direction, and the second sensing electrodes 540 may be arranged in the column direction and the row direction. The first sensing electrodes 520 may be connected to each other in the column direction by first sensing electrode connectors 521, and the second sensing electrodes 540 may be connected to each other in the row direction by the second sensing electrode connector 541.

The first sensing electrodes 520 and the second sensing electrodes 540 may be positioned on the same layer. Depending on embodiments, the first sensing electrodes 520 and the second sensing electrodes 540 may be positioned on different layers. The first sensing electrodes 520 and the second sensing electrodes 540 may have rhombus shapes, but are not limited thereto. The first sensing electrodes 520 and the second sensing electrodes 540 may be polygons such as quadrangles or hexagons, or may be circles or ovals, and they may be realized to have various shapes with, for example, protrusions so as to improve sensitivity of the sensor. The first sensing electrodes 520 and the second sensing electrodes 540 may be made with transparent conductors or opaque conductors. For example, the first sensing electrodes 520 and the second sensing electrodes 540 may include transparent conductive oxides (TCO), and the transparent conductive oxides (TCO) may include at least one of an indium tin oxide (ITO), an indium zinc oxide (IZO), a zinc oxide (ZnO), carbon nanotubes (CNT), or graphene. The first sensing electrodes 520 and the second sensing electrodes 540 may include a plurality of openings. The openings formed in the sensing electrodes 520 and 540 allow the light discharged from the light emitting diode (LED) to be discharged to the front without interference.

The first sensing electrodes 520 may be electrically connected to each other by the first sensing electrode connector (521, or a bridge), and the second sensing electrodes 540 may be electrically connected to each other by the second sensing electrode connector 541. When the first sensing electrodes 520 are connected in the first direction, the second sensing electrodes 540 may be connected in the second direction crossing the first direction. When the first sensing electrodes 520 and the second sensing electrodes 540 are positioned on the same layer, one of the first sensing electrode connector 521 and the second sensing electrode connector 541 may be positioned on the same layer as the first sensing electrodes 520 and the second sensing electrodes 540, and the other thereof may be positioned on a different layer from the first sensing electrodes 520 and the second sensing electrodes 540. As a result, the first sensing electrodes 520 and the second sensing electrodes 540 may be electrically separated from each other. The sensing electrode connector positioned on the different layer may be positioned on an upper layer or a lower layer of the first sensing electrode 520 and the second sensing electrode 540, and according to some embodiments to be described below, some embodiments in which the sensing electrode connector is positioned on the lower layer, that is, on the layer that is nearer the substrate.

The sensing wires 512 and 522 respectively connected to the first sensing electrodes 520 and the second sensing electrodes 540 are positioned in the non-display area PA. The sensing wires 512 and 522 may include a plurality of first sensing wires 512 and a plurality of second sensing wires 522. The first sensing wires 512 may be connected to a plurality of second sensing electrodes 540 arranged in the row direction, and the second sensing wires 522 may be connected to a plurality of first sensing electrodes 520 arranged in the column direction. Depending on embodiments, the first sensing wires 512 and the second sensing wires 522 may be electrically connected to some of the pads PAD included in the pad unit 30 of FIG. 4.

FIG. shows a mutual-cap type sensor for sensing touches by using two sensing electrodes 520 and 540. However, depending on embodiments, a self-cap type of sensor for sensing touches by using one sensing electrode may be formed.

A display device according to some embodiments will now be described with the focus on the cross-section of the display area DA with reference to FIG. 6.

Figure 6:
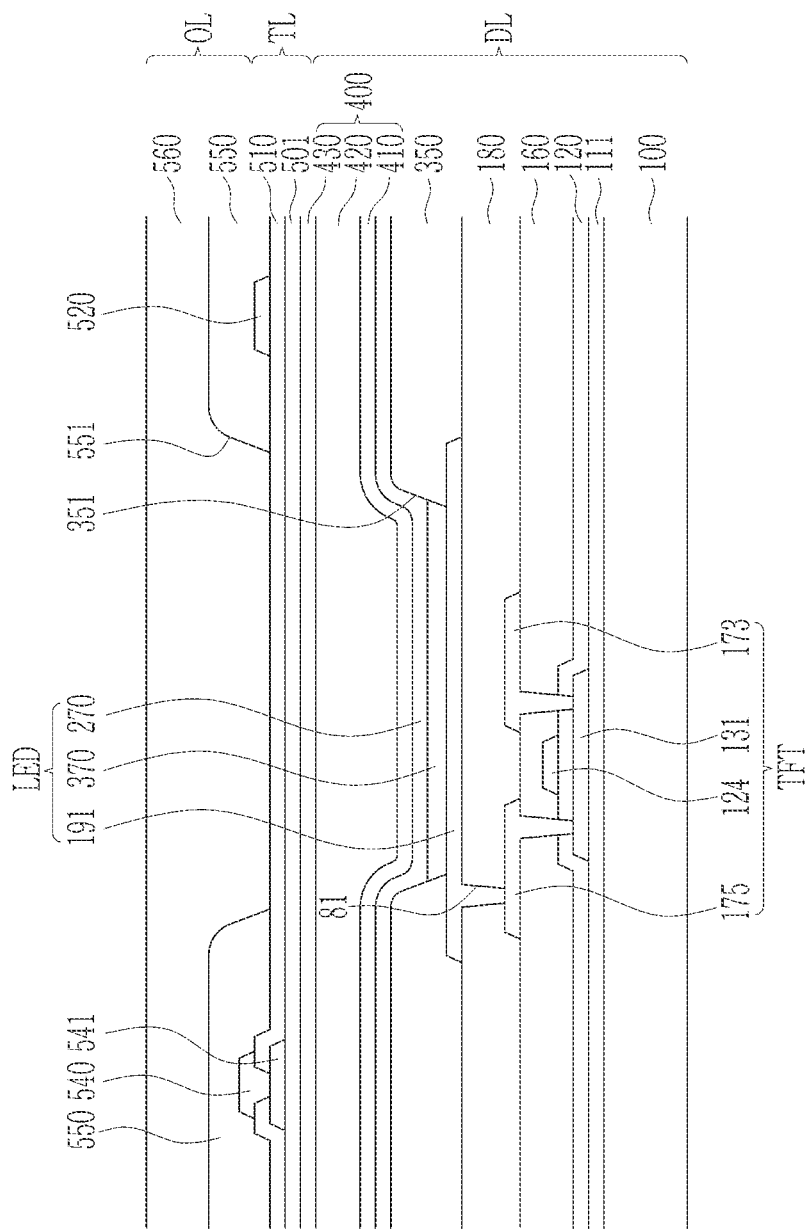
FIG. 6 shows a cross-sectional view of a portion of a display area in a display device according to some embodiments.

FIG. 6 shows a cross-sectional view of a portion of a display area in a display device according to some embodiments.

As shown in FIG. 6, the display area DA in a display device according to some embodiments may include: a substrate 100; a transistor TFT positioned on the substrate 100 and including a semiconductor 131, a gate electrode 124, a source electrode 173, and a drain electrode 175; a gate insulating layer 120; a first interlayer insulating layer 160; a second interlayer insulating layer 180; a pixel electrode 191; an emission layer 370; a bank layer 350; a common electrode 270; and an encapsulation layer 400. Here, the pixel electrode 191, the emission layer 370, and the common electrode 270 may configure a light-emitting device LED. The display device may further include a sensing area TCA positioned on the upper portion of the display area DA, and the sensing area TCA may further include a first sensing insulating layer 510, a plurality of sensing electrodes 520 and 540, and a second sensing electrode connector 541. The display device may further include a first insulating layer 550 and a second insulating layer 560 positioned on the upper portion of the sensing area TCA.

The substrate 100 may include a rigid material such as glass, or a flexible material such as plastic or a polyimide, that may be bent. A buffer layer 111 for smoothing a surface of the substrate 100 and blocking permeation of impurities may be positioned on the substrate 100. The buffer layer 111 may include an inorganic material, for example, it may include an inorganic insulating material such as a silicon nitride (SiNx), a silicon oxide (SiOx), or a silicon oxynitride (SiOxNy). The buffer layer 111 may be a single-layered or multilayered structure of the material. A barrier layer may be further positioned on the substrate 100. The barrier layer may be positioned between the substrate 100 and the buffer layer 111. The barrier layer may include an inorganic insulating material such as a silicon nitride (SiNx), a silicon oxide (SiOx), or a silicon oxynitride (SiOxNy). The barrier layer BA may be a single-layered or multi-layered structure of the material.

The semiconductor 131 may be positioned on the substrate 100. The semiconductor 131 may include one of amorphous silicon, polycrystalline silicon, and an oxide semiconductor. For example, the semiconductor 131 may include a low temperature polycrystalline silicon (LTPS) or may include an oxide semiconductor material including at least one of zinc (Zn), indium (In), gallium (Ga), tin (Sn), or a mixture thereof. For example, the semiconductor 131 may include an indium-gallium-zinc Oxide (IGZO). The semiconductor 131 may include a channel region, a source region, and a drain region distinguished by whether impurities are doped thereto. The source region and the drain region may have conductive characteristics corresponding to conductors.

The gate insulating layer 120 may cover the semiconductor 131 and the substrate 100. The gate insulating layer 120 may include an inorganic insulating material such as a silicon nitride (SiNx), a silicon oxide (SiOx), or a silicon oxynitride (SiOxNy). The gate insulating layer 120 may be a single-layered or multilayered structure of the material.

The gate electrode 124 may be positioned on the gate insulating layer 120. The gate electrode 124 may include a metal such as copper (Cu), molybdenum (Mo), aluminum (Al), silver (Ag), chromium (Cr), tantalum (Ta), or titanium (Ti), or a metal alloy thereof. The gate electrode 124 may be a single layer or a multilayer. A region of the semiconductor 131 overlapping the gate electrode 124 in a plan view may be a channel region.

The first interlayer insulating layer 160 may cover the gate electrode 124 and the gate insulating layer 120. The first interlayer insulating layer 160 may include an inorganic insulating material such as a silicon nitride (SiNx), a silicon oxide (SiOx), or a silicon oxynitride (SiOxNy). The first interlayer insulating layer 160 may be a single-layered or multilayered structure of the material.

The source electrode 173 and the drain electrode 175 may be position on the first interlayer insulating layer 160. The source electrode 173 and the drain electrode 175 are respectively connected to the source region and the drain region of the semiconductor 131 by the openings formed in the first interlayer insulating layer 160 and the gate insulating layer 120. Hence, the above-described semiconductor 131, the gate electrode 124, the source electrode 173, and the drain electrode 175 configure one transistor TFT. Depending on embodiments, the transistor TFT may not include the source electrode 173 and the drain electrode 175 but may include the source region and the drain region of the semiconductor 131.

The source electrode 173 and the drain electrode 175 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), or tantalum (Ta), or a metal alloy thereof. The source electrode 173 and the drain electrode 175 may be a single layer or a multilayer. The source electrode 173 and the drain electrode 175 according to some embodiments may be configured to be a triple layer including an upper layer, an intermediate layer, and a lower layer, the upper layer and the lower layer may include titanium (Ti), and the intermediate layer may include aluminum (Al).

The second interlayer insulating layer 180 may be positioned on the source electrode 173 and the drain electrode 175. The second interlayer insulating layer 180 covers the source electrode 173, the drain electrode 175, and the first interlayer insulating layer 160. The second interlayer insulating layer 180 planarizes the surface of the substrate 100 on which transistors TFT are installed, it may be an organic insulator, and it may include at least one material of polyimide, polyamide, acryl resin, benzocyclobutene, and phenol resin.

The pixel electrode 191 may be positioned on the second interlayer insulating layer 180. The pixel electrode 191 may also be referred to as an anode, and it may be a single layer including a transparent conductive oxide film or a metal material, or a multilayer including the same. The transparent conductive oxide film may include an indium tin oxide (ITO), a poly-ITO, an indium zinc oxide (IZO), an indium gallium zinc oxide (IGZO), and an indium tin zinc oxide (ITZO). The metal material may include silver (Ag), molybdenum (Mo), copper (Cu), gold (Au), and aluminum (Al).

The second interlayer insulating layer 180 may include a via hole 81 exposing the drain electrode 175. The drain electrode 175 and the pixel electrode 191 may be physically and electrically connected to each other through the via hole 81 of the second interlayer insulating layer 180. Accordingly, the pixel electrode 191 may receive an output current to be transmitted to the emission layer 370 from the drain electrode 175.

A bank layer 350 may be positioned on the pixel electrode 191 and the second interlayer insulating layer 180. The bank layer 350 is also referred to as a pixel defining layer (PDL), and includes a pixel opening 351 overlapping at least part of the pixel electrode 191. The pixel opening 351 may overlap a center portion of the pixel electrode 191, and may not overlap an edge of the pixel electrode 191. Therefore, the pixel opening 351 may be smaller than the pixel electrode 191. The bank layer 350 may partition a formation position of the emission layer 370 so that the emission layer 370 may be positioned on a portion in which an upper side of the pixel electrode 191 is exposed. The bank layer 350 may be an organic insulator including at least one material of polyimide, polyamide, acryl resin, benzocyclobutene, and phenol resin. Depending on embodiments, the bank layer 350 may include a light blocking material. Here, the light blocking material may include a resin or a paste including carbon black, carbon nanotubes, a black dye, metal particles, for example, nickel, aluminum, molybdenum, and an alloy thereof, metal oxide particles (e.g., a chromium oxide), or metal nitride particles (e.g., a chromium nitride). When the bank layer 350 includes the light blocking material, reflection of external light by metallic structures located on a lower side of the bank layer 350 may be reduced.

The emission layer 370 may be positioned in the pixel opening 351 partitioned by the bank layer 350. The emission layer 370 may include organic materials for emitting red, green, and blue light. The emission layer 370 for emitting red, green, and blue light may include a low molecular or polymer organic material. FIG. 6 shows a single-layered emission layer 370, and in actuality, auxiliary layers such as an electron injecting layer, an electron transport layer, a hole transport layer, and a hole injecting layer may be positioned above/below the emission layer 370, and the hole injecting layer and the hole transport layer may be positioned below the emission layer 370, and the electron transport layer and the electron injecting layer may be positioned above the emission layer 370

The common electrode 270 may be positioned on the bank layer 350 and the emission layer 370. The common electrodes 270 may also be referred to as a cathode, and may be made of a transparent conductive layer including an indium tin oxide (ITO), an indium zinc oxide (IZO), an indium gallium zinc oxide (IGZO), and an indium tin zinc oxide (ITZO). The common electrodes 270 may have a semi-transparent characteristic, and it may configure a microcavity with the pixel electrode 191. According to the microcavity structure, light with a specific wavelength is discharged upward by a gap between two electrodes and the characteristic, thereby displaying the red, the green, or the blue.

The encapsulation layer 400 may be positioned on the common electrode 270. The encapsulation layer 400 may include at least one inorganic film and at least one organic film. According to some embodiments, the encapsulation layer 400 may include a first inorganic encapsulation layer 410, an organic encapsulation layer 420, and a second inorganic encapsulation layer 430. This is, however, an example, and the number of inorganic films and organic films configuring the encapsulation layer 400 is modifiable in many ways. The first inorganic encapsulation layer 410, the organic encapsulation layer 420, and the second inorganic encapsulation layer 430 may be positioned in part of the display area DA and the non-display area PA. Depending on embodiments, the organic encapsulation layer 420 is formed with respect to the display area (DA), and the first inorganic encapsulation layer 410 and the second inorganic encapsulation layer 430 may be positioned up to the non-display area PA. The encapsulation layer 400 protects the light-emitting device LED from moisture or oxygen that may be input from the outside, and one end portions of the first inorganic encapsulation layer 410 and the second inorganic encapsulation layer 430 may directly contact each other.

A buffer layer 501 may be positioned on the encapsulation layer 400. The buffer layer 501 may be made of an inorganic insulating layer, and the inorganic material included in the inorganic insulating layer may be at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, or a silicon oxynitride. Depending on embodiments, the buffer layer 501 may be omitted.

A second sensing electrode connector 541, a first sensing insulating layer 510, and a plurality of sensing electrodes 520 and 540 may be positioned on the buffer layer 501. One of the first sensing electrode connector 521 and the second sensing electrode connector 541 may be positioned on the same layer as the sensing electrodes 520 and 540, and the other may be positioned on a layer that is different from that of the sensing electrodes 520 and 540. An example in which the second sensing electrode connector 541 is positioned on the layer that is different from that of the sensing electrodes 520 and 540 will now be described.

The second sensing electrode connector 541, the first sensing insulating layer 510, and the sensing electrodes 520 and 540 may constitute a detecting sensor. The detecting sensor may be classified into a resistive type, a capacitive type, an electro-magnetic type, and an optical type. The detecting sensor according to some embodiments may use the capacitive sensor.

The second sensing electrode connector 541 may be positioned on the buffer layer 501, and the first sensing insulating layer 510 may be positioned on the buffer layer 501 and the second sensing electrode connector 541. The first sensing insulating layer 510 may include an inorganic insulating material or an organic insulating material. The inorganic insulating material may include at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, or a silicon oxynitride. The organic insulating material may include at least one of an acryl-based resin, a methacryl-based resin, polyisoprene, a vinyl-based resin, an epoxy-based resin, a urethane-based resin, a cellulose-based resin, or a perylene-based resin.

The sensing electrodes 520 and 540 may be positioned on the first sensing insulating layer 510. The sensing electrodes 520 and 540 may include a plurality of first sensing electrodes 520 and a plurality of second sensing electrodes 540. The first sensing electrode 520 and the second sensing electrode 540 may be electrically insulated from each other. The first sensing insulating layer 510 may include an opening for exposing an upper side of the second sensing electrode connector 541, and the second sensing electrode connector 541 may electrically connect the two second sensing electrodes 540 that are connected to the second sensing electrode 540 and are adjacent to each other through the opening of the first sensing insulating layer 510. The first sensing electrode connector 521 for connecting the first sensing electrode 520 may be formed on the same layer as the first sensing electrode 520 and the second sensing electrode 540.

The sensing electrodes 520 and 540 may have conductive materials with excellent conductivity. For example, the sensing electrodes 520 and 540 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), or tantalum (Ta), or a metal alloy thereof. The sensing electrodes 520 and 540 may be a single layer or a multilayer. The sensing electrodes 520 and 540 may include openings and may allow the light discharged by the light emitting diode to be discharged upward without interference. Depending on embodiments, the sensing electrodes 520 and 540 may be configured to be a triple layer including an upper layer, an intermediate layer, and a lower layer, and the upper layer and the lower layer may include titanium (Ti) and the intermediate layer may include aluminum (Al).

A first insulating layer 550 may be positioned on the sensing electrodes 520 and 540 and the first sensing insulating layer 510. The first insulating layer 550 may include a light-transmitting organic insulating material with a low refractive index. For example, the first insulating layer 550 may include at least one of an acrylic resin, a polyimide resin, a polyamide resin, or Alq3[Tris (8-hydroxyquinolinato)aluminum]. The first insulating layer 550 may have a relatively smaller refractive index than the second insulating layer 560 to be described. For example, the first insulating layer 550 may have the refractive index of 1.40 to 1.59.

The first insulating layer 550 includes an opening 551. The opening 551 represents a portion of the first sensing insulating layer 510, which is not covered by the first insulating layer 550. The opening 551 of the first insulating layer 550 may overlap the pixel opening 351. The opening 551 of the first insulating layer 550 may be greater than the pixel opening 351 in a plan view, and may surround the pixel opening 351. That is, the pixel opening 351 may be positioned in the opening 551 of the first insulating layer 550. A width of the opening 551 may gradually increase when approaching to the upper side from the lower side. That is, the width of the opening 551 may gradually increase when becoming distant from the encapsulation layer 400. Therefore, a lateral side of the first insulating layer 550 may be slanted with respect to the upper side of the encapsulation layer 400 by a predetermined inclined angle.

A spaced distance between the pixel opening 351 and the opening 551 of the first insulating layer 550 may be constant. A spaced distance between the pixel opening 351 and the opening 551 of the first insulating layer 550 represents a shortest distance between an edge of the pixel opening 351 and an edge of the opening 551. The edge of the pixel opening 351 represents a point where the edge of the bank layer 350 contacts the pixel electrode 191. The edge of the opening 551 represents a point where the edge of the first insulating layer 550 contacts the first sensing insulating layer 510. The spaced distance between the pixel opening 351 and the opening 551 of the first insulating layer 550 has been described to be constant, but is not limited thereto. The spaced distance between the pixel opening 351 and the opening 551 of the first insulating layer 550 in one pixel may be different with respect to position. Further, the spaced distance between the pixel opening 351 and the opening 551 of the first insulating layer 550 may be different for the respective pixels.

A second insulating layer 560 may be positioned on the first sensing insulating layer 510 and the first insulating layer 550. The second insulating layer 560 may include a light-transmitting organic insulating material with a high refractive index, and may be a planarized insulating layer. The second insulating layer 560 may have a relatively greater refractive index than the first insulating layer 550. For example, the second insulating layer 560 may have the refractive index of about 1.60 to about 1.90. The second insulating layer 560 may have the refractive index of about about 1.65 to about 1.85. For example, the second insulating layer 560 may include polydiarylsiloxane, methyltrimethoxysilane, or tetramethoxysilane. According to some embodiments, the second insulating layer 560 may be made of an acryl-based and/or siloxane-based organic material with the refractive index of about 1.6. According to some embodiments, the second insulating layer 560 may include suspended particles for high refraction. For example, metal oxide particles such as a zinc oxide (ZnOx), a titanium oxide titanium (TiO2), a zirconium oxide (ZrO2), or a barium titanite (BaTiO3) may be dispersed on the second insulating layer 560.

The second insulating layer 560 may be positioned in the opening 551 of the first insulating layer 550. The second insulating layer 560 contacts the lateral side of the first insulating layer 550. The second insulating layer 560 may be positioned on the upper side of the first insulating layer 550 so that it may contact the upper side of the first insulating layer 550.

The layer on which the constituent elements for generating light and displaying images such as the transistors TFT or the light-emitting devices LED are positioned may be classified as a display layer DL. The layer on which the constituent elements for sensing the signals input by the outside such as the sensing electrodes 520 and 540 or the sensing electrode connectors 521 and 541 are positioned may be classified as a sensing function layer TL. The layer on which the constituent elements for controlling paths of light provided by the display layer DL such as the first insulating layer 550 and the second insulating layer 560 are positioned may be classified as an optical function layer OL.

According to some embodiments, polarization layers including a linear polarizer and a retarder may be further positioned on the optical function layer OL. A cover window for covering the sensing area TCA and the display area DA may be further positioned on the optical function layer OL. An adhesive layer may be further positioned between the polarization layer and the cover window.

The optical function layer OL includes a first insulating layer 550 including the opening 551 and a second insulating layer 560 positioned in the opening 551 of the first insulating layer 550, thereby increasing frontal visibility and light-emitting efficiency of the display device. That is, at least a portion of the light generated by the light-emitting device LED is totally reflected at an interface between the first insulating layer 550 and the second insulating layer 560 so the light may be gathered at the front.

The light generated by the emission layer 370 may be emitted in many directions, and is input to the sensing area TCA with incident angles. At least a portion of the light input to the second insulating layer 560 of the optical function layer OL is reflected at the interface between the first insulating layer 550 and the second insulating layer 560.

Particularly, when the incident angle of the light input to the second insulating layer 560 is greater than a threshold angle, the input light may be totally reflected at the interface between the first insulating layer 550 and the second insulating layer 560. That is, as the light input to the second insulating layer 560 with a relatively great refractive index proceeds to the first insulating layer 550 with a relatively small refractive index, a total reflection of light may be generated at the interface between the first insulating layer 550 and the second insulating layer 560. By this, the light emitted in a direction that is not perpendicular to the surface of the substrate 100 from among the light generated by the light-emitting device LED passes through the first insulating layer 550 and the second insulating layer 560 and is totally reflected at the interface between the first insulating layer 550 and the second insulating layer 560 so the light may emit to the front of the display device that is the perpendicular direction to the surface.

Regarding the display device according to some embodiments, light efficiency may be further increased by adjusting the refractive index and thickness of the first insulating layer 550 and the thickness of the second insulating layer 560.

A display device according to some embodiments will now be described in more detail with reference to FIG. 7 and FIG. 8.

Figure 7:
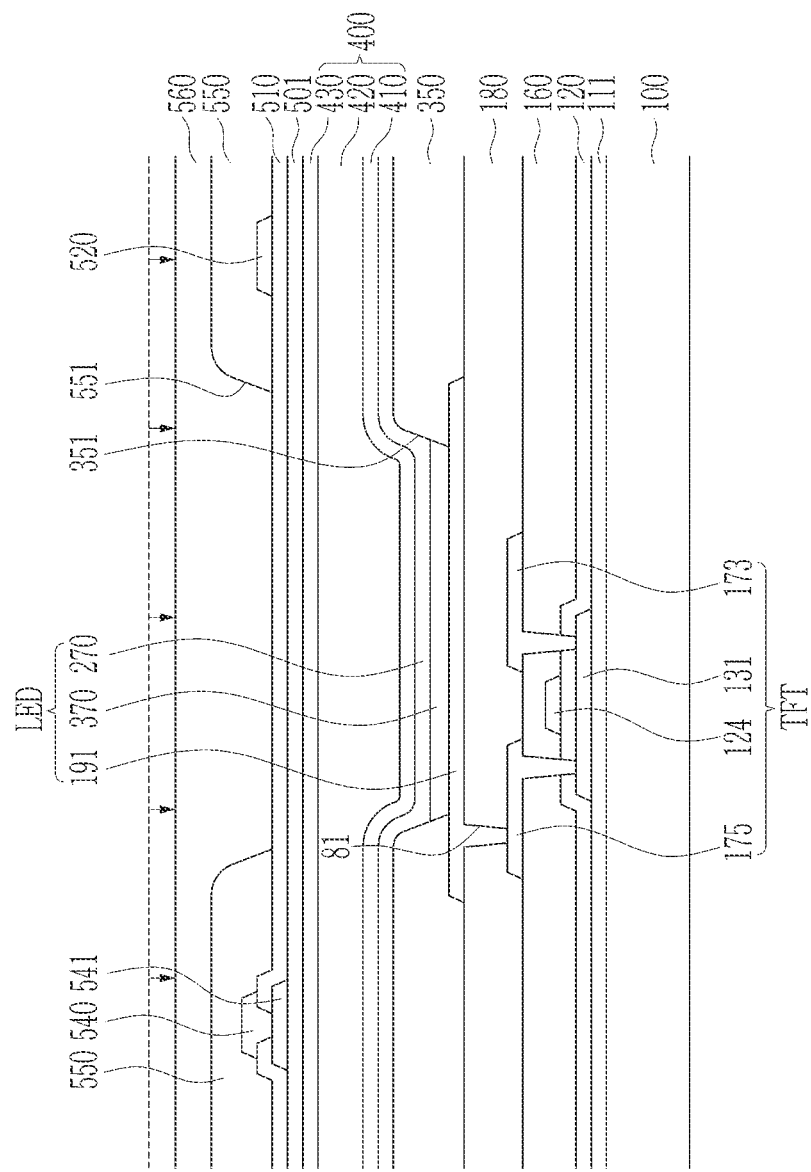
FIG. 7 shows a cross-sectional view of a display device according to some embodiments.
Figure 8:
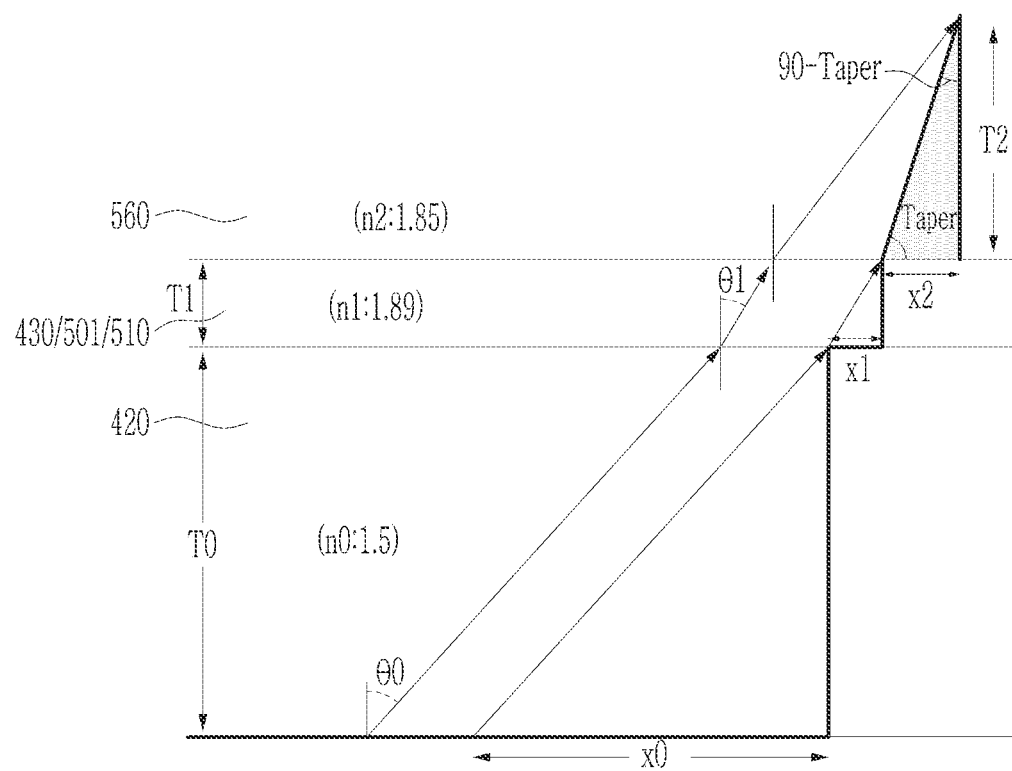
FIG. 8 shows an optical path on a predetermined layer of a display device according to some embodiments.

FIG. 7 shows a cross-sectional view of a display device according to some embodiments, and FIG. 8 shows an optical path on a predetermined layer of a display device according to some embodiments.

As shown in FIG. 7, the display device according to some embodiments includes: substrate 100, a transistor TFT positioned on the substrate 100, a light-emitting device LED connected to the transistor TFT, an encapsulation layer 400 positioned on the light-emitting device LED, sensing electrodes 520 and 540 positioned on the encapsulation layer 400, a first insulating layer 550 positioned on the sensing electrodes 520 and 540 and including the opening 551, and a second insulating layer 560 positioned on the encapsulation layer 400 and the first insulating layer 550.

According to some embodiments, the thickness of the second insulating layer 560 may be formed to be less than the above-described embodiments. For example, the thickness of the second insulating layer 560 may be equal to or greater than about 5 µm and may be equal to or less than about 15 µm.

The second insulating layer 560 may be formed to be thicker than the first insulating layer 550. That is, the second insulating layer 560 may fill the opening 551 of the first insulating layer 550, and may cover the upper side of the first insulating layer 550. However, without being limited thereto, the second insulating layer 560 may fill the opening 551 of the first insulating layer 550, and may not cover the upper side of the first insulating layer 550. That is, the second insulating layer 560 may cover a lateral inclined portion of the first insulating layer 550 and may not contact the upper side. The thickness of the second insulating layer 560 may be substantially equal to the thickness of the first insulating layer 550.

Regarding the paths of the light emitted by the light-emitting device LED with reference to FIG. 8 and Equation 1, the light may sequentially pass through the encapsulation layer 400, the layers 501 and 510 made of an inorganic insulating material, and the second insulating layer 560. While the light output by the light-emitting device LED passes through the layers with different refractive indexes, it may be refracted and may pass through the layers according to the Snell's law.

$$n0 \times \sin\theta0 = n1 \times \sin\theta1 \quad \text{Equation 1}$$

$$n1 \times \sin\theta1 = n2 \times \sin(2 \times (90-\text{Taper}))$$

$$T0 = \frac{x0}{\tan\theta0}$$

$$T1 = \frac{x1}{\tan\theta1}$$

$$T2 = \frac{x2}{\tan(90-2 \times (90-\text{Taper}))}$$

(n0: the refractive index of the organic encapsulation layer, n1: the refractive index of the inorganic insulating layers, n2: the refractive index of the second insulating layer, T0: the thickness of the organic encapsulation layer, T1: the thickness of the inorganic insulating layers, T2: the thickness of the second insulating layer, x0: the width of the light emitting region, x1: the spaced distance between the pixel opening and the opening of the first insulating layer, and x2: the width of the inclined portion of the first insulating layer).

The refractive index n0 of the organic encapsulation layer 420 may be about 1.50. The refractive index n1 of the inorganic insulating layers such as the second inorganic encapsulation layer 430, the buffer layer 501, and the first sensing insulating layer 510 may be about 1.89. Referring to Equation 1, assuming that the refractive index n1 of the first sensing insulating layer 510 and the incident angle θ1 of the light going toward the second insulating layer 560 are constant, a taper may increase as the refractive index n2 of the second insulating layer 560 increases. As the taper increases and the width x2 of the inclined portion of the first insulating layer is reduced, the minimum thickness of the second insulating layer 560 may be reduced. The minimum thickness of the second insulating layer 560 may be equal to the thickness of the first insulating layer 550. For example, the refractive index n2 of the second insulating layer 560 may be about 1.85, and the minimum thickness of the second insulating layer 560 may be about 5.5 µm. Depending on cases, the refractive index n2 of the second insulating layer 560 may be increased, and the thickness T2 may be reduced. In another way, the refractive index n2 of the second insulating layer 560 may be reduced, and the thickness T2 may be increased. To increase flatness of the upper side of the second insulating layer 560, it may be desirable to increase the thickness T2. For example, the thickness T2 of the second insulating layer 560 may be about 14 µm. For the purpose of comparison, a reference example in which the refractive index n2 of the second insulating layer 560 is about 1.65 and the thickness T2 is about 25 µm may be considered. The display device according to some embodiments may reduce the thickness T2 by increasing the refractive index n2 of the second insulating layer 560, compared to the reference example. When the thickness T2 of the second insulating layer 560 is reduced, the optical path for the light emitted by the light-emitting device LED to be discharged to the outside may be reduced, and luminance may be increased. That is, light efficiency of the display device according to some embodiments may be increased.

A display device according to some embodiments will now be described with reference to FIG. 9.

Figure 9:
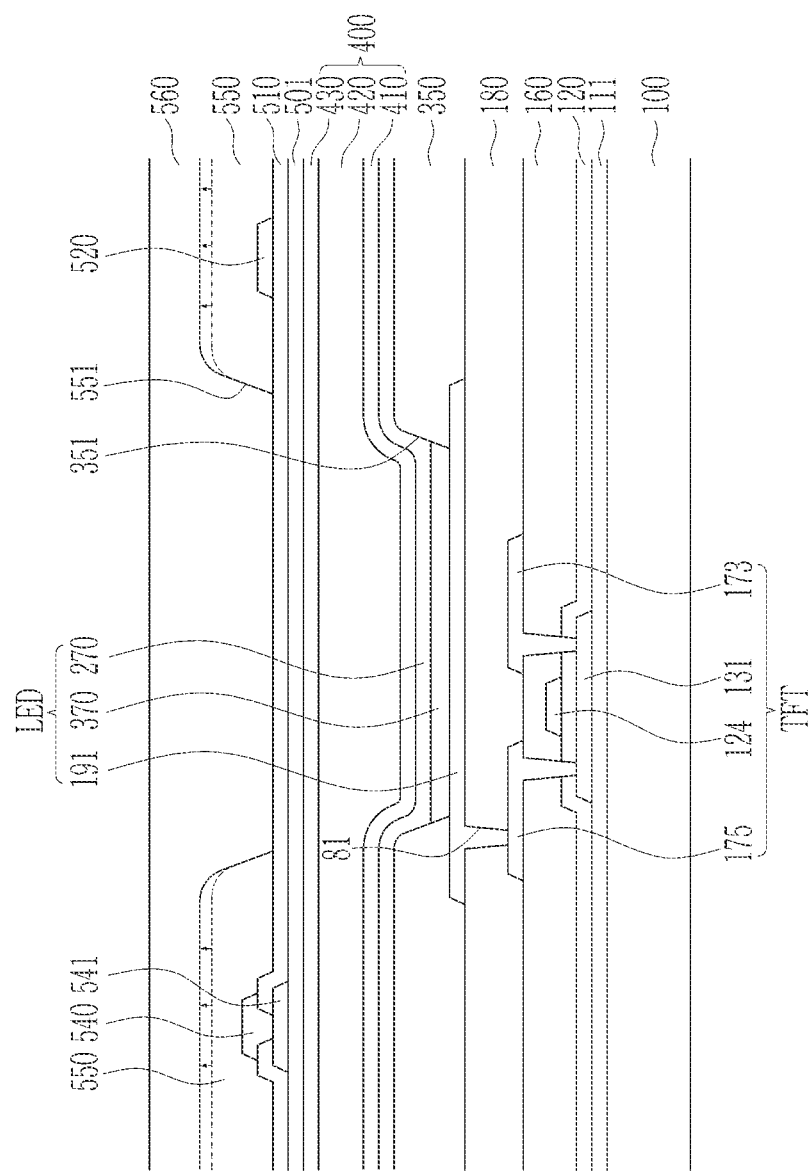
FIG. 9 shows a cross-sectional view of a display device according to some embodiments.

FIG. 9 shows a cross-sectional view of a display device according to some embodiments.

As shown in FIG. 9, the display device according to some embodiments includes: a substrate 100, a transistor TFT positioned on the substrate 100, a light-emitting device LED connected to the transistor TFT, an encapsulation layer 400 positioned on the light-emitting device LED, sensing electrodes 520 and 540 positioned on the encapsulation layer 400, a first insulating layer 550 positioned on the sensing electrodes 520 and 540 and including an opening 551, and a second insulating layer 560 positioned on the encapsulation layer 400 and the first insulating layer 550.

According to some embodiments, the first insulating layer 550 may be formed to be thicker than the previously-described embodiments. For example, the thickness of the first insulating layer 550 may be equal to or greater than about 2 μm, and may be equal to or less than about 5.5 μm.

The light output by the light-emitting device LED may pass through the second insulating layer 560 positioned in the opening 551 of the first insulating layer 550, may be totally reflected at the interface between the second insulating layer 560 and the first insulating layer 550, and may be output to the front. When the thickness of the second insulating layer 560 is reduced, a ratio for emitting light to the front may be reduced. On the contrary, when the thickness of the second insulating layer 560 increases, an amount of the totally reflected light increases, and the rate of outputting light to the front may increase.

A display device according to some embodiments will now be described with reference to FIG. 10.

Figure 10:
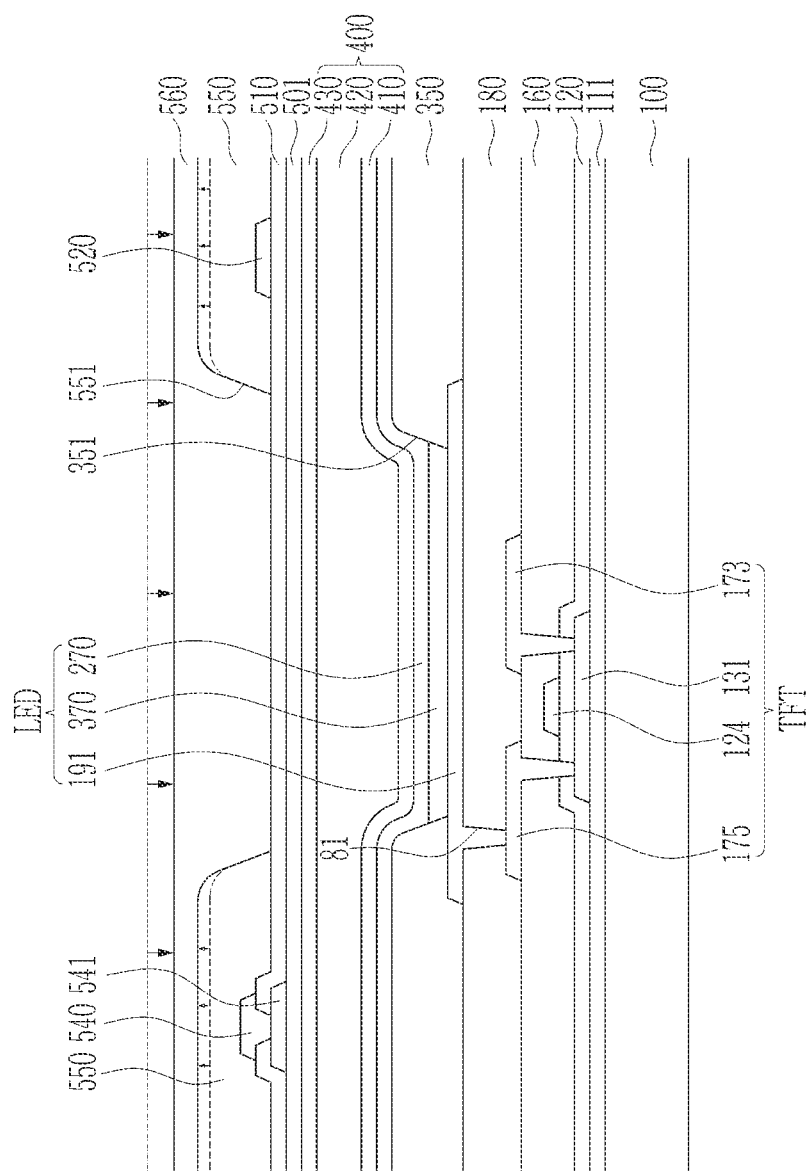
FIG. 10 shows a cross-sectional view of a display device according to some embodiments.

FIG. 10 shows a cross-sectional view of a display device according to some embodiments.

As shown in FIG. 10, the display device according to some embodiments includes: a substrate 100, a transistor TFT positioned on the substrate 100, a light-emitting device LED connected to the transistor TFT, an encapsulation layer 400 positioned on the light-emitting device LED, sensing electrodes 520 and 540 positioned on the encapsulation layer 400, a first insulating layer 550 positioned on the sensing electrodes 520 and 540 and including an opening 551, and a second insulating layer 560 positioned on the encapsulation layer 400 and the first insulating layer 550.

According to some embodiments, the thickness of the first insulating layer 550 may be increased and the thickness of the second insulating layer 560 may be reduced. For example, the thickness of the first insulating layer 550 may be equal to or greater than about 2 μm and equal to or less than about 5.5 μm, and the thickness of the second insulating layer 560 may be equal to or greater than about 5 μm and equal to or less than about 15 μm. The thickness of the second insulating layer 560 may be equal to or greater than the thickness of the first insulating layer 550. Hence, when the thickness of the first insulating layer 550 is about 5.5 μm, the thickness of the second insulating layer 560 may be equal to or greater than about 5.5 μm.

According to some embodiments, luminance of the display device may be increased when the thickness of the second insulating layer 560 is reduced, and the rate of outputting light to the front by the display device may be increased when the thickness of the first insulating layer 550 is increased. That is, the light efficiency of the display device according to some embodiments may be relatively increased.

When the thickness of the first insulating layer 550 may be increased in a like way of the embodiments described with respect to FIG. 9 and FIG. 10, a bad influence may be given to flowability of the second insulating layer 560, and the second insulating layer 560 may fail to fill the opening 551 of the first insulating layer 550 in a certain region. A display device according to some embodiments will now be described in more detail with reference to FIG. 11, which is a configuration for preventing or reducing generation of defects.

Figure 11:
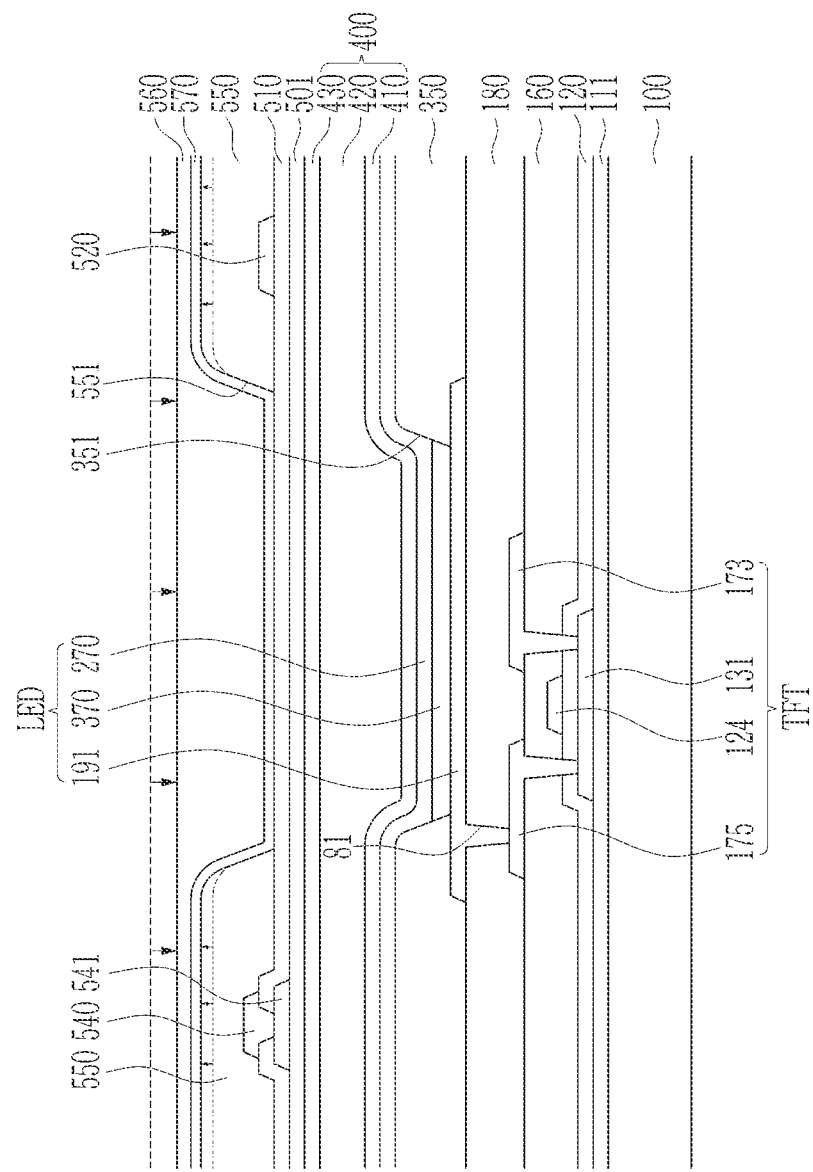
FIG. 11 shows a cross-sectional view of a display device according to some embodiments.

FIG. 11 shows a cross-sectional view of a display device according to some embodiments.

As shown in FIG. 11, the display device according to some embodiments includes: a substrate 100, a transistor TFT positioned on the substrate 100, a light-emitting device LED connected to the transistor TFT, an encapsulation layer 400 positioned on the light-emitting device LED, sensing electrodes 520 and 540 positioned on the encapsulation layer 400, a first insulating layer 550 positioned on the sensing electrodes 520 and 540 and including an opening 551, and a second insulating layer 560 positioned on the encapsulation layer 400 and the first insulating layer 550.

Some embodiments may further include a third insulating layer 570 positioned on the first insulating layer 550. The third insulating layer 570 may be positioned between the first insulating layer 550 and the second insulating layer 560. The third insulating layer 570 may be positioned on the first insulating layer 550 and the first sensing insulating layer 510. The third insulating layer 570 may be positioned on the first sensing insulating layer 510 in the opening 551 of the first insulating layer 550. The third insulating layer 570 may cover the lateral inclined portion of the first insulating layer 550. The third insulating layer 570 may cover the upper side of the first insulating layer 550.

The third insulating layer 570 may include a silicon nitride (SiNx). However, without being limited thereto, the third insulating layer 570 may include an inorganic insulating material such as a silicon oxide (SiOx) or a silicon oxynitride (SiOxNy).

Regarding to a process for manufacturing a display device according to some embodiments, the first insulating layer 550 may be patterned to form an opening 551, a third insulating layer 570 is formed on the first insulating layer 550, and a second insulating layer 560 may be formed on the third insulating layer 570. The thickness of the first insulating layer 550 may be equal to or greater than about 2 μm and may be equal to or less than about 5.5 μm. The third insulating layer 570 may be made of an inorganic insulating material and may have the thickness of equal to or less than about 500 Å. For example, the thickness of the third insulating layer 570 may be about 300 Å. Hence, the opening 551 of the first insulating layer 550 is not entirely filled with the third insulating layer 570. The opening 551 of the first insulating layer 550 may be filled with the second insulating layer 560. As described above, when the thickness of the first insulating layer 550 is increased, a material for forming the second insulating layer 560 may not be input into the opening 551 in a process for coating the material for forming the second insulating layer 560. That is, entry barriers of the material for forming the second insulating layer 560 may become higher because of the increase of the thickness of the first insulating layer 550. Regarding the display device according to some embodiments, the third insulating layer 570 is formed to cover the surface of the first insulating layer 550 so the entry barriers may be lowered. Therefore, the defect that the second insulating layer 560 is not formed in the opening 551 of the first insulating layer 550 may be prevented or reduced.

Flatness of the upper side of the second insulating layer 560 may be influenced according to a type of the material of the third insulating layer 570. For example, the as roughness of the surface of the third insulating layer 570 is reduced, the flatness of the upper side of the second insulating layer 560 may increase. When the third insulating layer 570 is made of a silicon nitride (SiNx) and its surface roughness is measured, the roughness is found to be about 0.23 nm to about 0.83 nm (the error range is ±0.1 nm). There are some differences depending on processing conditions. When the third insulating layer 570 is made of a silicon oxide (SiOx) and its surface roughness is measured, the roughness is found to be about 2.3 nm (the error range is ±0.1 nm). Hence, when the third insulating layer 570 is made of a silicon nitride (SiNx), the surface roughness may be relatively low, and hence, the flatness of the upper side of the second insulating layer 560 may be increased. As the flatness of the upper side of the second insulating layer 560 increases, influences such as reflection of external light may be reduced, and quality of the display device according to some embodiments may be increased.

The optical path may also be influenced according to the type of the material of the third insulating layer 570. The refractive index of the silicon nitride (SiNx) may be about 1.89, and the refractive index of the silicon oxide (SiOx) may be about 1.77. When the refractive index of the second insulating layer 560 is about 1.85, it may be desirable to select the silicon nitride (SiNx) that has a relatively small difference of the refractive index from the second insulating layer 560 as the material of the third insulating layer 570, which may reduce the change of the optical path. That is, the refractive index of the third insulating layer 570 may be similar to the refractive index of the second insulating layer 560.

Light efficiency of a display device according to some embodiments will now be described with reference to FIG. 12.

Figure 12:
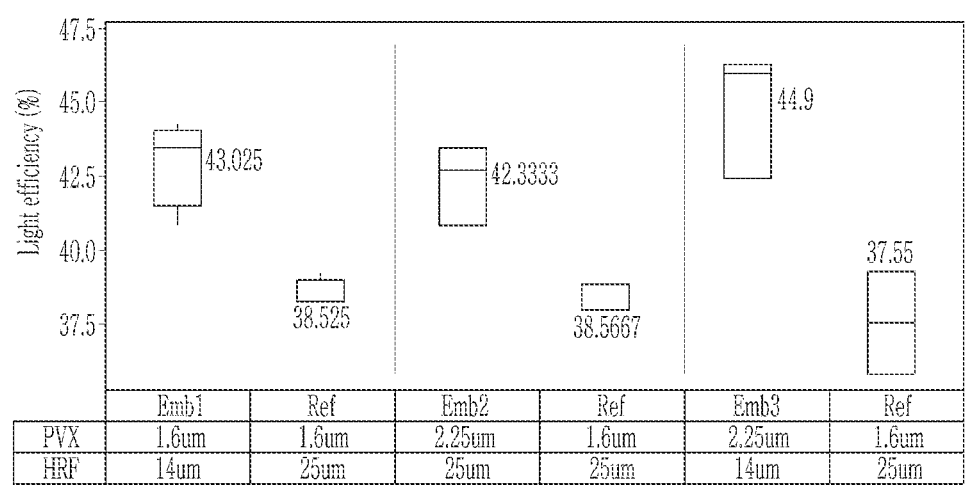
FIG. 12 shows optical efficiencies of various display devices according to some embodiments and a display device according to some systems.

FIG. 12 shows optical efficiencies of various display devices according to some embodiments and a display device according to a reference example. The display device Ref according to a reference example in FIG. 12 shows the case in which the thickness of the first insulating layer 550 is about 1.6 μm, the refractive index of the second insulating layer 560 is about 1.65, and the thickness of the second insulating layer 560 is about 25 μm.

The display device according to some embodiments shows three cases of a first display device Emb1, a second display device Emb2, and a third display device Emb3. The first display device Emb1 reduces the thickness of the second insulating layer 560 in a like way of the embodiments described with reference to FIG. 7, indicating the case that the thickness of the first insulating layer 550 is about 1.6 μm, the refractive index of the second insulating layer 560 is about 1.85, and the thickness of the second insulating layer 560 is about 14 μm. The second display device Emb2 increases the thickness of the first insulating layer 550 in a like way of the embodiments described with reference to FIG. 9, indicating the case in which the thickness of the first insulating layer 550 is about 2.25 μm, the refractive index of the second insulating layer 560 is about 1.65, and the thickness of the second insulating layer 560 is about 25 μm. The third display device Emb3 increases the thickness of the first insulating layer 550 and reduces the thickness of the second insulating layer 560 in a like way of the embodiments described with reference to FIG. 10, showing the case in which the thickness of the first insulating layer 550 is about 2.25 μm, the refractive index of the second insulating layer 560 is about 1.85, and the thickness of the second insulating layer 560 is about 14 μm.

As shown in FIG. 12, the light efficiency of the display device Ref according to a reference example is about 38.525, and the light efficiency of the first display device Emb1 according to some embodiments is about 43.025. Hence, it is found that the light efficiency of the display device according to some embodiments increases as the refractive index of the second insulating layer 560 increases and the thickness of the second insulating layer 560 is reduced.

The light efficiency of the display device Ref according to a reference example is about 38.5667, and the light efficiency of the display device Emb2 according to the second display device is about 42.3333. Hence, it is found that the light efficiency of the display device according to some embodiments increases as the thickness of the first insulating layer 550 increases.

The light efficiency of the display device Ref according to a reference example is about 37.55, and the light efficiency of the display device Emb3 according to the third display device may be about 44.9. Therefore, it is found that the light efficiency of the display device according to some embodiments is further increased as the thickness of the first insulating layer 550 increases, the refractive index of the second insulating layer 560 increases, and the thickness of the second insulating layer 560 is reduced.

While aspects of some embodiments of the present disclosure have been described in connection with what is presently considered to be practical example embodiments, it is to be understood that embodiments according to the present invention are not limited to the disclosed embodiments, but, on the contrary, is intended to cover various modifications and equivalent arrangements included within the spirit and scope of the appended claims, and their equivalents.

DESCRIPTION OF SOME OF THE REFERENCE SYMBOLS

100: substrate
400: encapsulation layer
520, 540: sensing electrode
550: first insulating layer
551: opening
560: second insulating layer
570: third insulating layer

What is claimed is:
1. A display device comprising:
a substrate;
a transistor on the substrate;
a light-emitting device connected to the transistor;
an encapsulation layer on the light-emitting device;
a sensing electrode on the encapsulation layer;
a first insulating layer on the sensing electrode and including an opening in the first insulating layer overlapping the light-emitting device;
a second insulating layer on the encapsulation layer and the first insulating layer; and
a third insulating layer between the first insulating layer and the second insulating layer and extending across the opening in the first insulating layer such that the third insulating layer is between the second insulating layer and the light-emitting device at the opening,
wherein a refractive index of the second insulating layer is greater than a refractive index of the first insulating layer, and
wherein the encapsulation layer is disposed between the light-emitting device and the third insulating layer, and the encapsulation layer includes a first inorganic encapsulation layer, an organic encapsulation layer, and a second inorganic encapsulation layer.
2. The display device of claim 1, wherein the third insulating layer includes an inorganic insulating material.

3. The display device of claim 2, wherein the third insulating layer includes a silicon nitride or a silicon oxynitride.

4. The display device of claim 1, wherein the refractive index of the second insulating layer is in a range of 1.60 to 1.90.

5. The display device of claim 4, wherein the refractive index of the first insulating layer is in a range of 1.40 to 1.59.

6. The display device of claim 4, wherein the second insulating layer is thicker than the first insulating layer.

7. The display device of claim 6, wherein a thickness of the second insulating layer is in a range of 5 micrometers (μm) to 15 μm.

8. The display device of claim 7, wherein the refractive index of the second insulating layer is 1.85, and the thickness of the second insulating layer is 14 μm.

9. The display device of claim 7, wherein the thickness of the first insulating layer is 2 μm to 5.5 μm.

10. The display device of claim 6, wherein a thickness of the third insulating layer is equal to or less than 500 Å.

11. The display device of claim 10, wherein the third insulating layer includes a silicon nitride.

12. The display device of claim 6, wherein
an opening of the first insulating layer is filled with the second insulating layer and the third insulating layer,
a lateral side and an upper side of the first insulating layer are covered by the third insulating layer, and
an upper side of the third insulating layer is covered by the second insulating layer.

13. A display device comprising:
a substrate;
a transistor on the substrate;
a light-emitting device connected to the transistor;
an encapsulation layer on the light-emitting device;
a sensing electrode on the encapsulation layer;
a first insulating layer on the sensing electrode and including an opening overlapping the light-emitting device;
a second insulating layer on the encapsulation layer and the first insulating layer; and
a third insulating layer between the first insulating layer and the second insulating layer and extending across the opening in the first insulating layer such that the third insulating layer is between the second insulating layer and the light-emitting device at the opening,
wherein a refractive index of the second insulating layer is greater than a refractive index of the first insulating layer,
wherein the encapsulation layer is disposed between the light-emitting device and the third insulating layer,
the encapsulation layer includes a first inorganic encapsulation layer, an organic encapsulation layer, and a second inorganic encapsulation layer, and
a thickness of the second insulating layer is in a range of 5 μm to 15 μm.

14. The display device of claim 13, wherein the second insulating layer is thicker than the first insulating layer.

15. The display device of claim 14, wherein the thickness of the first insulating layer is in a range of 2 micrometers (μm) to 5.5 μm.

16. The display device of claim 13, wherein the refractive index of the second insulating layer is in a range of 1.60 to 1.90.

17. The display device of claim 16, wherein the refractive index of the first insulating layer is 1.40 to 1.59.

18. The display device of claim 13, wherein
the thickness of the third insulating layer is equal to or less than 500 Å.

19. The display device of claim 13, wherein the third insulating layer includes a silicon nitride or a silicon oxynitride.

* * * * *